(12) United States Patent
Chen et al.

(10) Patent No.: US 7,256,092 B2
(45) Date of Patent: Aug. 14, 2007

(54) METHOD FOR FABRICATING INTEGRATED CIRCUITS HAVING BOTH HIGH VOLTAGE AND LOW VOLTAGE DEVICES

(75) Inventors: Jung-Ching Chen, Tai-Chung Hsien (TW); Jy-Hwang Lin, Hsin-Chu (TW); Sheng-Hsiung Yang, Hsin-Chu (TW); Jim Su, Yun-Lin Hsien (TW)

(73) Assignee: United Microelectronics Corp., Hsin-Chu (TW)

( * ) Notice: Subject to any disclaimer, the term of this patent is extended or adjusted under 35 U.S.C. 154(b) by 357 days.

(21) Appl. No.: 10/710,616

(22) Filed: Jul. 25, 2004

(65) Prior Publication Data

US 2006/0017114 A1  Jan. 26, 2006

(51) Int. Cl.
 *H01L 21/8232* (2006.01)
(52) U.S. Cl. ........................ 438/275; 257/500
(58) Field of Classification Search ............... 438/275, 438/276; 257/500
 See application file for complete search history.

(56) References Cited

U.S. PATENT DOCUMENTS

| | | | |
|---|---|---|---|
| 6,417,044 B1 * | 7/2002 | Ono | 438/241 |
| 6,531,363 B2 * | 3/2003 | Uchida | 438/275 |
| 2002/0068406 A1 * | 6/2002 | Ishii | 438/275 |
| 2003/0235960 A1 * | 12/2003 | Hayashi | 438/275 |

* cited by examiner

*Primary Examiner*—Sara Crane
*Assistant Examiner*—Colleen Matthews
(74) *Attorney, Agent, or Firm*—Winston Hsu

(57) ABSTRACT

A high-voltage semiconductor MOS process that is fully compatible with low-voltage MOS process is provided. The high-voltage N/P well are implanted into the substrate prior to the definition of active areas. The channel stop doping regions are formed after the formation of field oxide layers, thus avoiding lateral diffusion of the channel stop doping regions. In addition, the grade drive-in process used to activate the grade doping regions in the high-voltage device area and the gate oxide growth of the high-voltage devices are performed simultaneously.

12 Claims, 18 Drawing Sheets

METHOD FOR FABRICATING INTEGRATED CIRCUITS HAVING BOTH HIGH VOLTAGE AND LOW VOLTAGE DEVICES

BACKGROUND OF INVENTION

1. Field of the Invention

The present invention relates generally to the manufacture of semiconductor MOS devices. More particularly, the present invention relates to a high-voltage semiconductor MOS making process that is compatible with low-voltage semiconductor MOS making process.

2. Description of the Prior Art

Integrated circuits (ICs) containing both high-voltage and low-voltage devices such as high/low voltage MOS transistor devices are known in the art. For example, the low-voltage device may be used in the control circuits as the high-voltage device may be used in electrically programmable read only memory (EPROM) or the driving circuits of the liquid crystal display.

Isolation structures such as field oxide layers, which increase the distance between the gate and the source/drain and further decrease the transverse electric field in the channel, are used for preventing short channel effects of the high-voltage MOS device. Thus, the high-voltage MOS transistor devices can function during high-voltage (30V~40V) operations.

Hitherto, for the ICs having both high-voltage and low-voltage devices, the production process applied for the low-voltage device is still limited to 0.5 to 0.6 micron technologies. However, in order to increase the integrity of the ICs, it is necessary to introduce more advanced technology, for instance, below 0.35-micron technology. Inevitably, complex anti-punch-through doping or multistep well doping must be applied to produce a low-voltage device in such a small size to adjust the electrical properties of the device, and to prevent the punch-through problems that occur in the low-voltage device.

In addition to increasingly complex process steps for high/low voltage devices, there are some other drawbacks when applying prior art 40V high-voltage process in combination with advanced 3.3V low-voltage process. First, severe field oxide encroachment under SiN leads to control problems of length and width of the active areas in the low-voltage device region. This is because the formation of the post-implant oxide for both high-voltage N-well (HVNW) and the high-voltage P-well (HVPW), thermal drive-in for the HVNW and the HVPW, and removal of the post-implant oxide are executed after the SiN definition of active area.

Secondly, formation and removal of the sacrificial oxide layer during the drive-in step for the grade doping regions (parts of source/drain regions of high-voltage devices) in the high-voltage device area lead to field oxide edge thinning, and thus adversely affecting low-voltage devices. Serious kink effects are observed when operating the low-voltage devices.

Further, in accordance with the prior art method, the field doping layers in the high-voltage device area, which function as a channel stop, are implanted into the substrate prior to the formation of field oxide layers. This is disadvantageous because the dopants in the field doping layers will laterally diffuse when taking subsequent high-temperature grade doping region drive-in.

Moreover, fence defect is found at the boundary between the high-voltage device area and the low-voltage device area after the definition and etching of polysilicon gates. This is because the poly gate for the high-voltage devices and poly gate of the low-voltage devices are defined by using two photo masks according to the prior art.

SUMMARY OF INVENTION

Accordingly, it is the primary object of the present invention to provide a method for fabricating integrated circuits having both high-voltage and low-voltage devices, which is capable of solving the above-mentioned problems.

Another object of the present invention is to provide a high voltage (30~40V) process that is fully compatible with low voltage (3~4V) process.

According to the claimed invention, a method of fabricating integrated circuits having both high voltage and low voltage devices is disclosed. A provided substrate contains at least one high-voltage device area and at least one low-voltage device area, and a first pad oxide layer over the substrate. The method comprises the following steps:

performing a first ion implantation process to form a first ion well of a first conductivity type in the substrate within the high-voltage device area;

performing a second ion implantation process to form a second ion well of a second conductivity type in the substrate within the high-voltage device area;

stripping the first pad oxide layer;

forming a second pad oxide layer;

forming a masking layer over the second pad oxide layer;

forming a plurality of openings in the masking layer to exposed a portion of the second pad oxide layer;

performing a third ion implantation process to implant ions of the first conductivity type into the second ion well within the high-voltage device area, to form a first drift layer;

thereafter performing a fourth ion implantation process to implant ions of the first conductivity type into the low-voltage device area, to form a third ion well of the first conductivity type;

thereafter performing a fifth ion implantation process to implant ions of the second conductivity type into the low-voltage device area, to form a fourth ion well of the second conductivity type;

thereafter performing a sixth ion implantation process to implant ions of the second conductivity type into the first ion well within the high-voltage device area, to form a second drift layer;

performing an oxidation process to form a plurality of field oxide isolation structures through the openings in the masking layer;

removing the masking layer and the second pad oxide layer;

forming a first gate oxide layer over the substrate;

performing a seventh and eighth ion implantation processes to implant ions of the first conductivity type into the second ion well and implant ions of the second conductivity type into the first ion well, thereby forming a first channel stop regions within the high-voltage device area;

performing a ninth ion implantation process to form a second channel stop region in the fourth ion well within the low-voltage device area;

forming an anti-punch-through doping region in the fourth ion well;

removing the first gate oxide layer within the low-voltage device area;

growing a second gate oxide layer within the low-voltage device area; and forming a plurality of gate structures on the first and second gate oxide layers.

Other objects, advantages and novel features of the invention will become more clearly and readily apparent from the following detailed description when taken in conjunction with the accompanying drawings.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

The present invention is directed to an improved method for making an integrated circuit having both high-voltage and low-voltage devices. It is noteworthy that the present invention is suited for making high-voltage MOS devices that have gate and drain terminals operated at a high voltage of about 30~40V and low-voltage MOS devices that have gate and drain terminals operated at a relatively low voltage of about 3~4V that is lower than conventional art (5~6V). The gate oxide for the high-voltage MOS devices (also referred to as "high-voltage gate oxide") has a thickness of about 700~900 angstroms and the gate oxide for the low-voltage MOS devices (also referred to as "low-voltage gate oxide") has a thickness of about 50~70 angstroms. The present invention method is specifically suited for the manufacture of high voltage device having field oxide under gate structure and drift layers under the field oxide. The low-voltage devices according to this invention are particular LDD type MOS devices, but not limiting. The abbreviation "HV" and "LV", which are occasionally seen in the detailed description of the specification, stand for "high voltage" and "low-voltage", respectively. The abbreviation "HVNW" and "LVPW", which are also occasionally seen in the detailed description of the specification, stand for "high-voltage N well" and "low-voltage P well", respectively.

Figure 1:
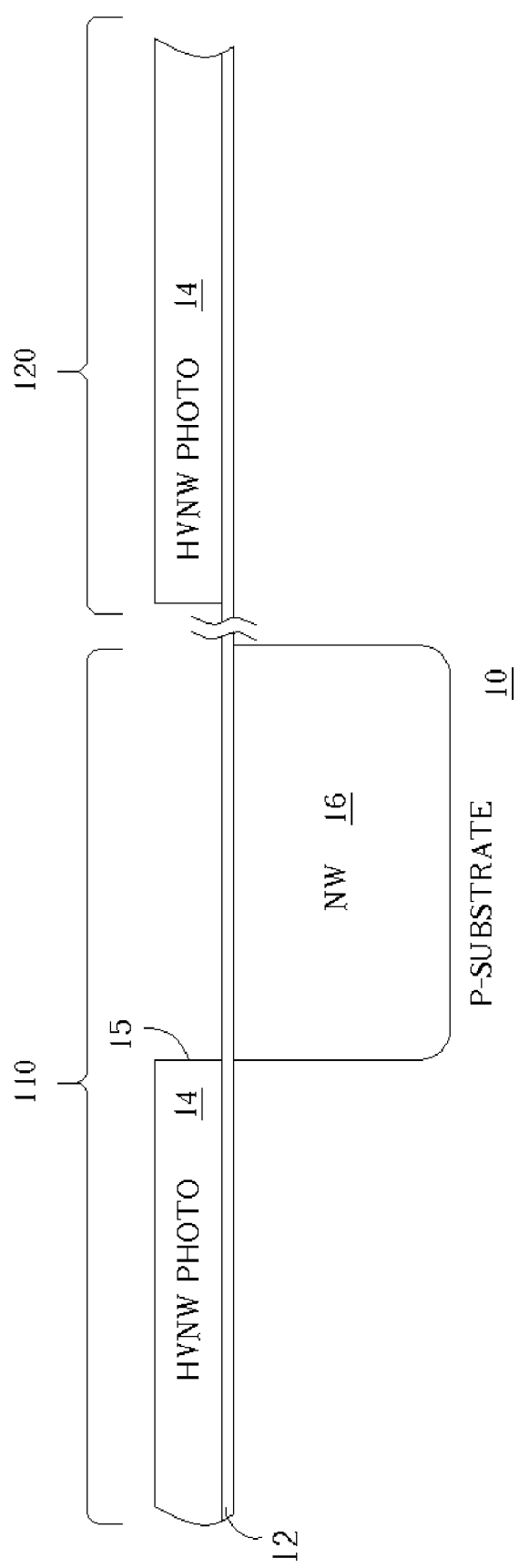
FIG. 1 to FIG. 18 are schematic, cross-sectional diagrams illustrating the process steps of fabricating the integration of high-voltage devices and low-voltage devices according to a preferred embodiment of this invention.

Please now refer to FIG. 1 to FIG. 18, which are schematic, cross-sectional diagrams illustrating the process steps of fabricating the integration of high-voltage devices and low-voltage devices according to a preferred embodiment of this invention. As shown in FIG. 1, a semiconductor substrate 10 such as a P type silicon substrate is prepared. As specifically indicated, the semiconductor substrate 10 comprises at least a high voltage device area 110 and a low voltage device area 120. In the high voltage (30~40V) device area 110, a plurality of high voltage MOS transistor devices are to be formed on the semiconductor substrate 10. In the low voltage device area 120, a plurality of low voltage (3~4V) MOS transistor devices are to be formed in the subsequent processes.

Utilizing the zeroth layer alignment, in accordance with the preferred embodiment, a HVNW photo resist layer 14 is patterned on a pad oxide layer 12. The HVNW photo resist layer 14 masks the low voltage device area 120 and portions of the high voltage device area 110 except the area to be N type implanted (N well region or high voltage N well region). The HVNW photo resist layer 14 has an opening 15 exposing the high voltage N well region. An N type ion implantation is carried out to dope the semiconductor substrate 10 with N type dopants such as phosphorus through the opening 15 to form an N well 16 in the high voltage device area 110. Subsequently, a thermal drive-in process is carried out to activate the doped N well 16. The resist layer 14 is then stripped off. It is noteworthy that the wafer is aligned by zeroth layer alignment marks that are typically formed on scribe lines in trench patterns.

Figure 2:
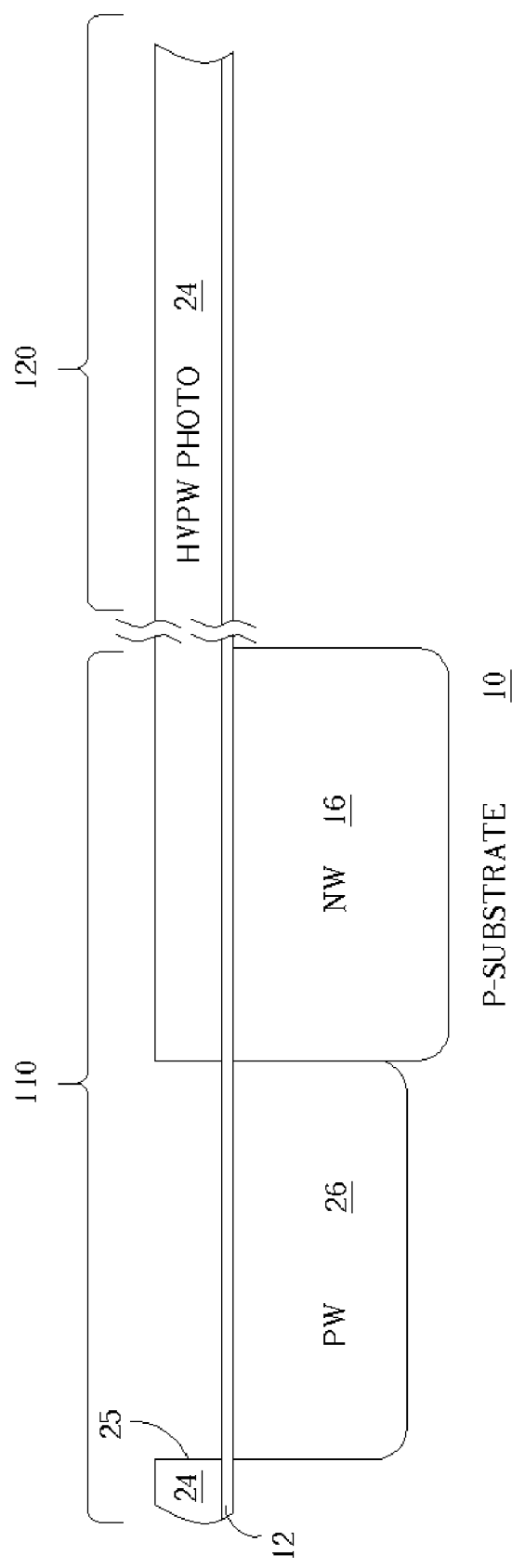

As shown in FIG. 2, likewise, utilizing the zeroth layer alignment, a HVPW photo resist layer 24 is patterned on the pad oxide layer 12. The HVPW photo resist layer 24 masks the low voltage device area 120 and high voltage N well regions of the high voltage device area 110 except the area to be P type implanted (i.e., P well region or high voltage P well region). The HVPW photo resist layer 24 has an opening 25 exposing the high voltage P well region. P type ion implantation is carried out to dope the semiconductor substrate 10 with P type dopants such as boron through the opening 25 to form a P well 26 in the high voltage device area 110. Thereafter, the photo resist layer 24 and the pad oxide layer 12 are removed. A high-temperature thermal process is performed to drive in dopants in the wells.

Figure 3:
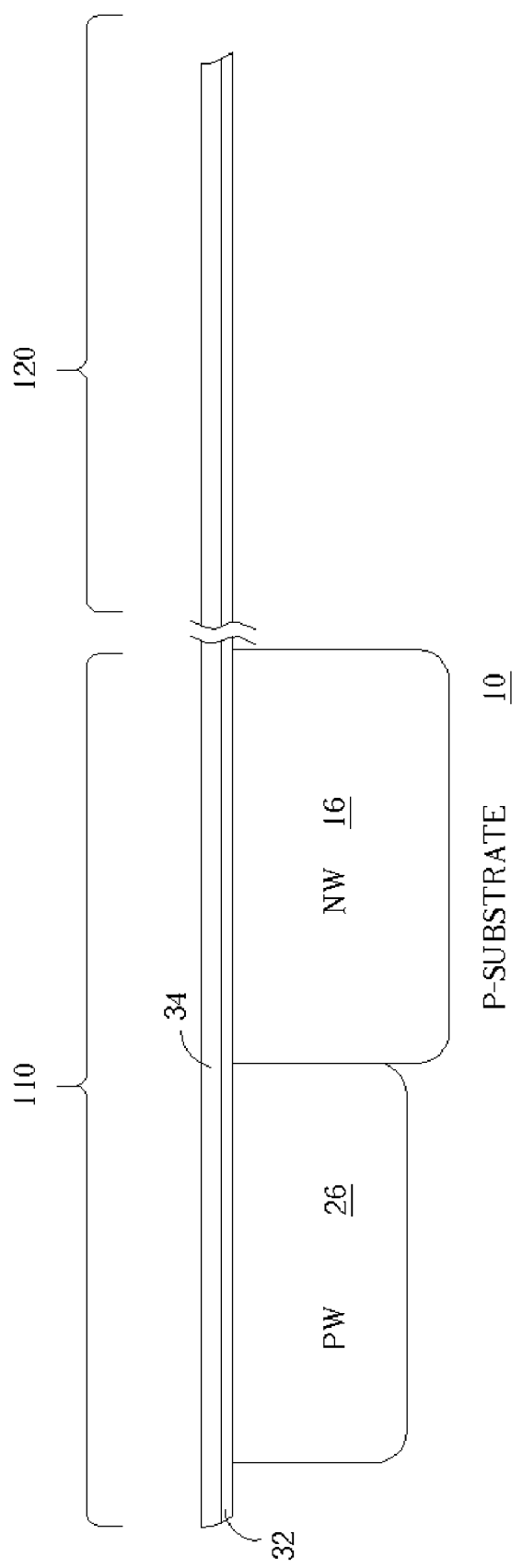

As shown in FIG. 3, a pad oxide layer 32 is formed on the surface of the semiconductor substrate 10. A conventional chemical vapor deposition (CVD) process is then performed to deposit a silicon nitride layer 34 over the pad oxide layer 32. Preferably, the thickness of the silicon nitride layer 34 is about 1500 angstroms.

Figure 4:
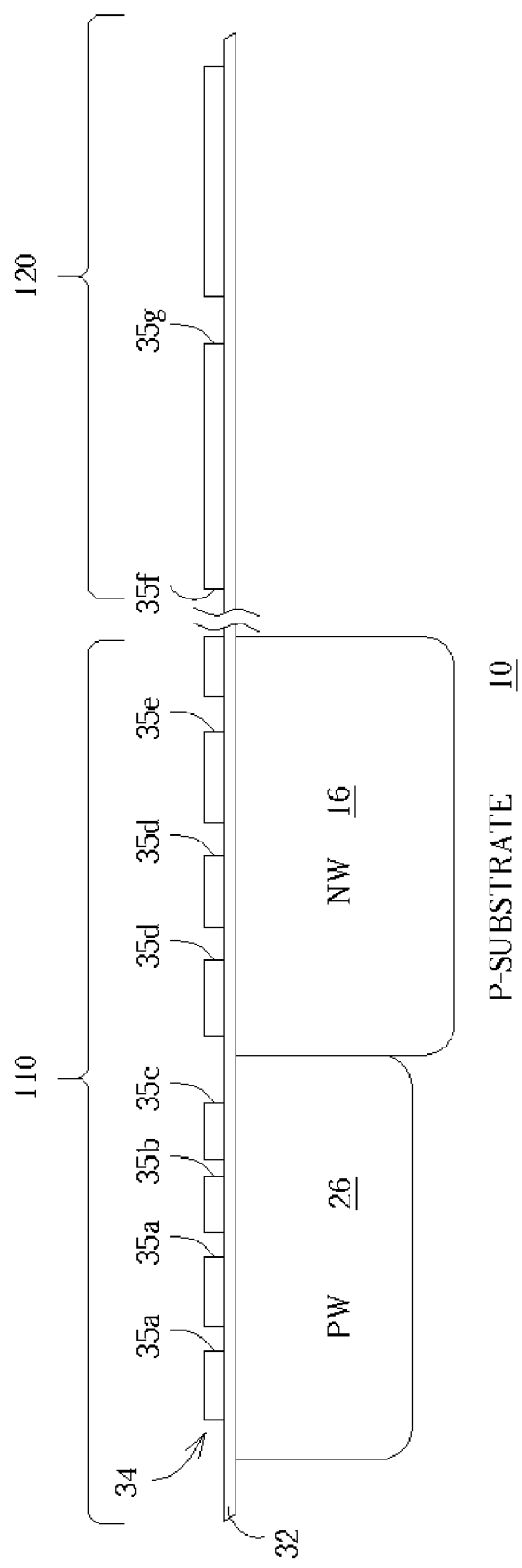

As shown in FIG. 4, a conventional photolithographic process and an etching process are performed to form a plurality of openings 35a, 35b, 35c, 35d, 35e, 35f, and 35g in the silicon nitride layer 34. These openings, which expose a portion of the pad oxide layer 32, define the pattern of the field oxide isolation layer to be formed in subsequent processes.

Figure 5:
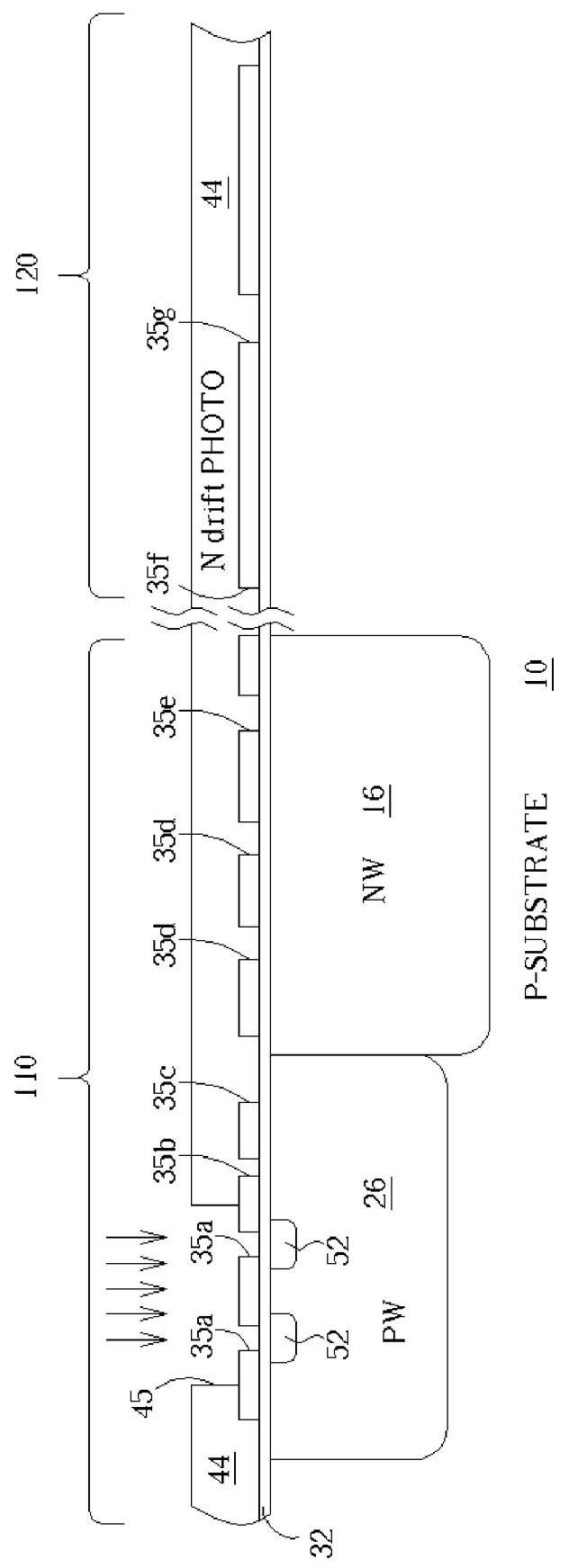

As shown in FIG. 5, a lithographic process is carried out to form a resist pattern 44 over the semiconductor substrate 10. The resist pattern 44, which is also referred to as N-DRIFT photo, is used to define the N-drift layer in the high voltage device area 110. The resist pattern 44 has an opening 45 communicating the openings 35a of the silicon nitride layer 34 above the high-voltage P well 26. A self-aligned N type ion implantation is carried out to dope the semiconductor substrate 10 through the opening 45 and the openings 35a, thereby forming N drift layers 52 (for HV NMOS devices) within the high-voltage P well (HVPW) 26. A thermal drive-in process is then performed to activate the N drift layers 52. The resist pattern 44 is removed.

Figure 6:
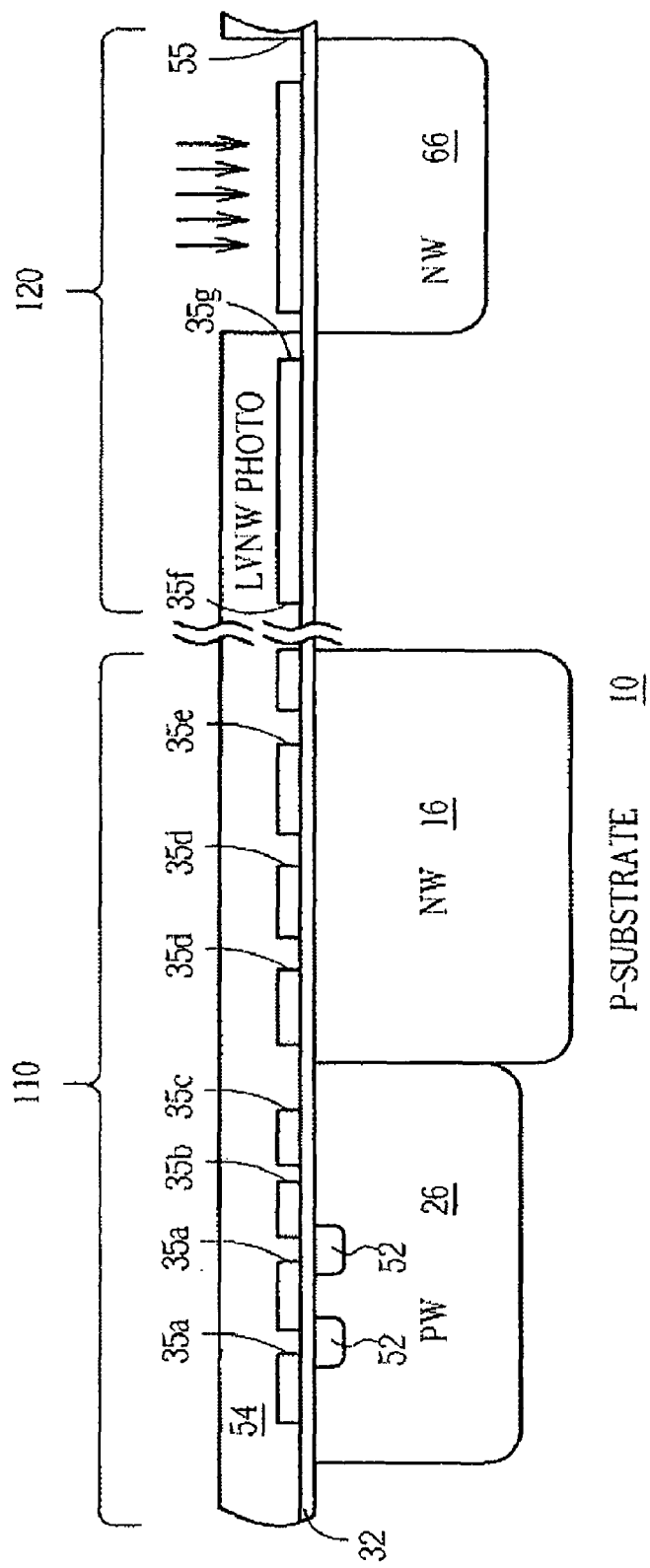

As shown in FIG. 6, after forming the N drift layers 52, a resist pattern 54, which is also referred to as LVNW photo, is used to define the N well region in the low voltage device area 120. The resist pattern 54 has an opening 55, through which N type dopants are implanted into the semiconductor substrate 10 to form an N well 66 in the low voltage device area 120. The resist pattern 54 is then removed.

Figure 7:
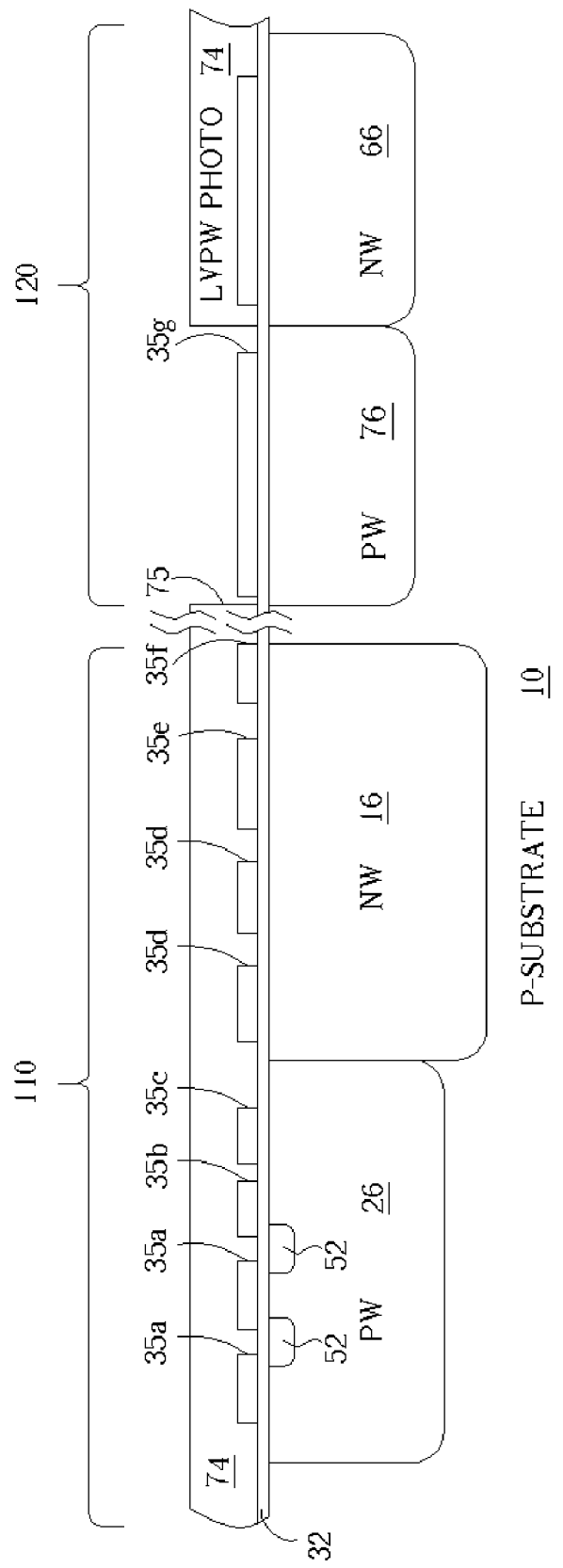

As shown in FIG. 7, after the doping of the N well 66, another resist pattern 74, which is also referred to as LVPW photo, is used to define the P well region in the low voltage device area 120. The resist pattern 74 has an opening 75, through which P type dopants are implanted into the semiconductor substrate 10 to form a P well 76 in the low voltage device area 120. The resist pattern 74 is then removed. After this, the N well 66 and P well 76 drive-in (or LV well drive-in) process is performed.

Figure 8:
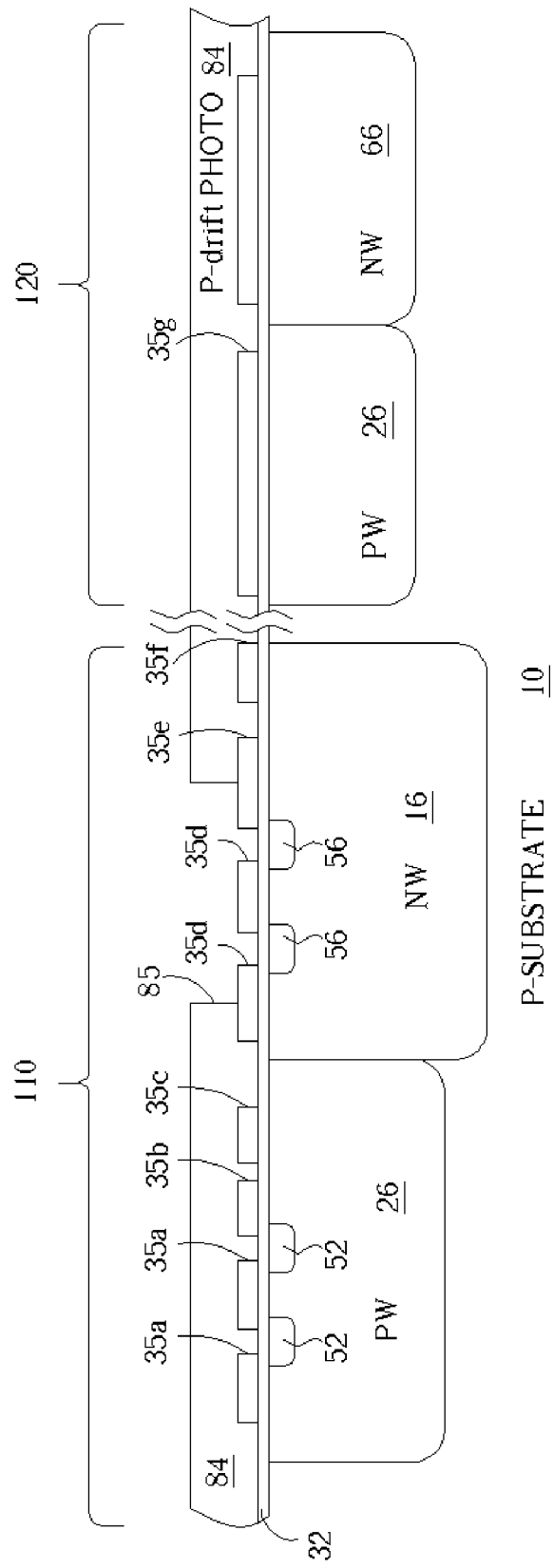

As shown in FIG. 8, a conventional lithographic process is performed to form a resist pattern 84 over the semiconductor substrate 10. The resist pattern 84, which is also referred to as P-DRIFT photo, is used to define the P-drift layer in the high voltage device area 110. The resist pattern 84 has an opening 85 communicating the openings 35d of the silicon nitride layer 34 above the high-voltage N well 16. A self-aligned P type ion implantation is carried out to dope the semiconductor substrate 10 through the opening 85 and the openings 35d, thereby forming P drift layers 56 (for HV PMOS devices) within the high-voltage N well (HVNW) 26. The photo resist pattern 84 is then removed.

Figure 9:
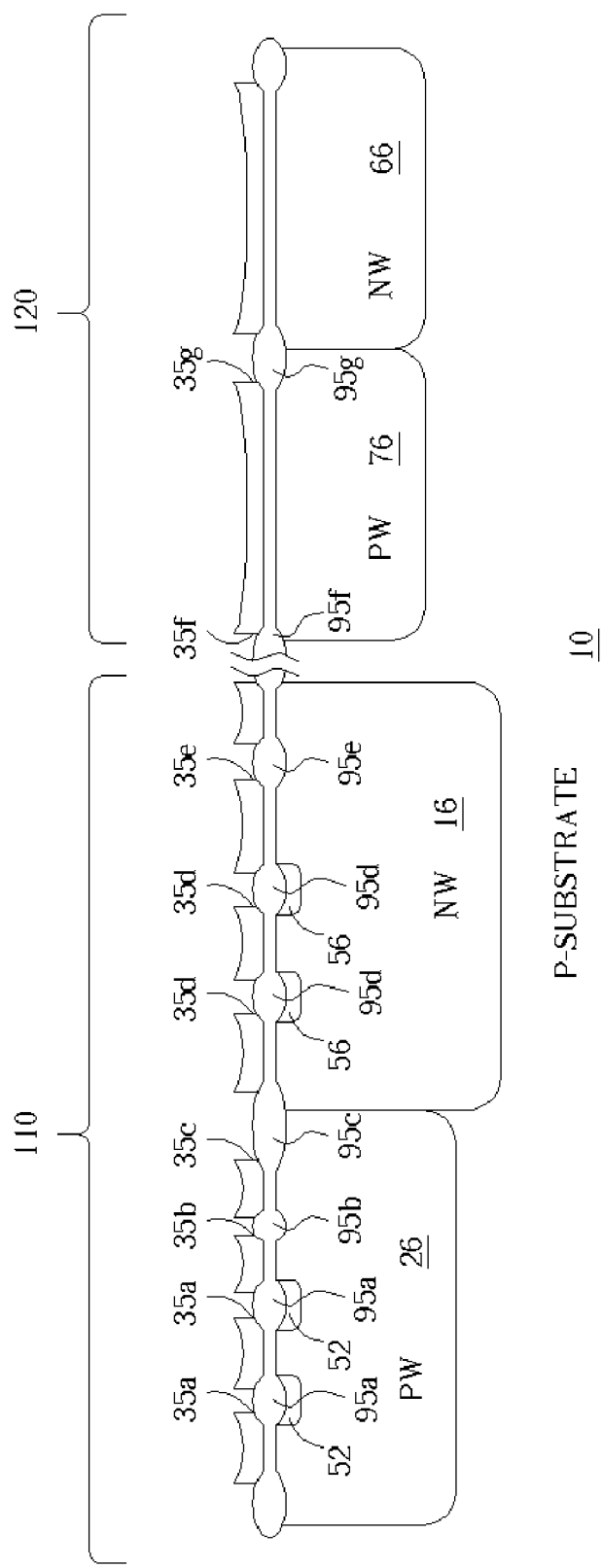

As shown in FIG. 9, a thermal oxidation process is carried out to form field oxide layers on the surface of the semiconductor substrate 10 where are not masked by the silicon nitride layer 34. Through the openings 35a, 35b, 35c, 35d, 35e, 35f, and 35g in the silicon nitride layer 34, the field oxide layers 95a, 95b, 95c, 95d, 95e, 95f, and 95g are formed, respectively. The field oxide layers 95a are formed on the N drift layer 52, and the field oxide layers 95d are formed on the N drift layer 56.

Figure 10:
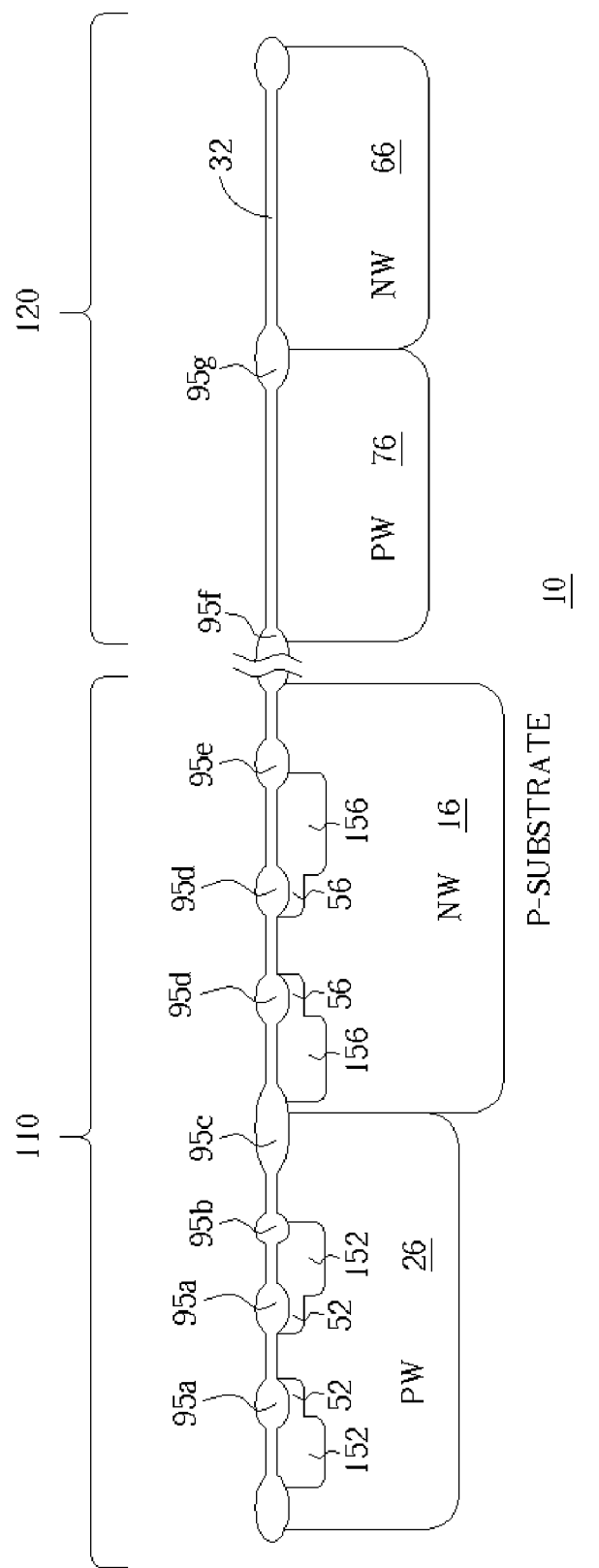

As shown in FIG. 10, the silicon nitride layer 34 is removed. Lithographic and ion implantation processes are then performed to form N grade region 152 and P grade region 156 in the HVPW 26 and the HVNW 16, respectively. The N grade region 152 borders the N drift layer 52, while the P grade region 156 borders the P drift layer 56.

Figure 11:
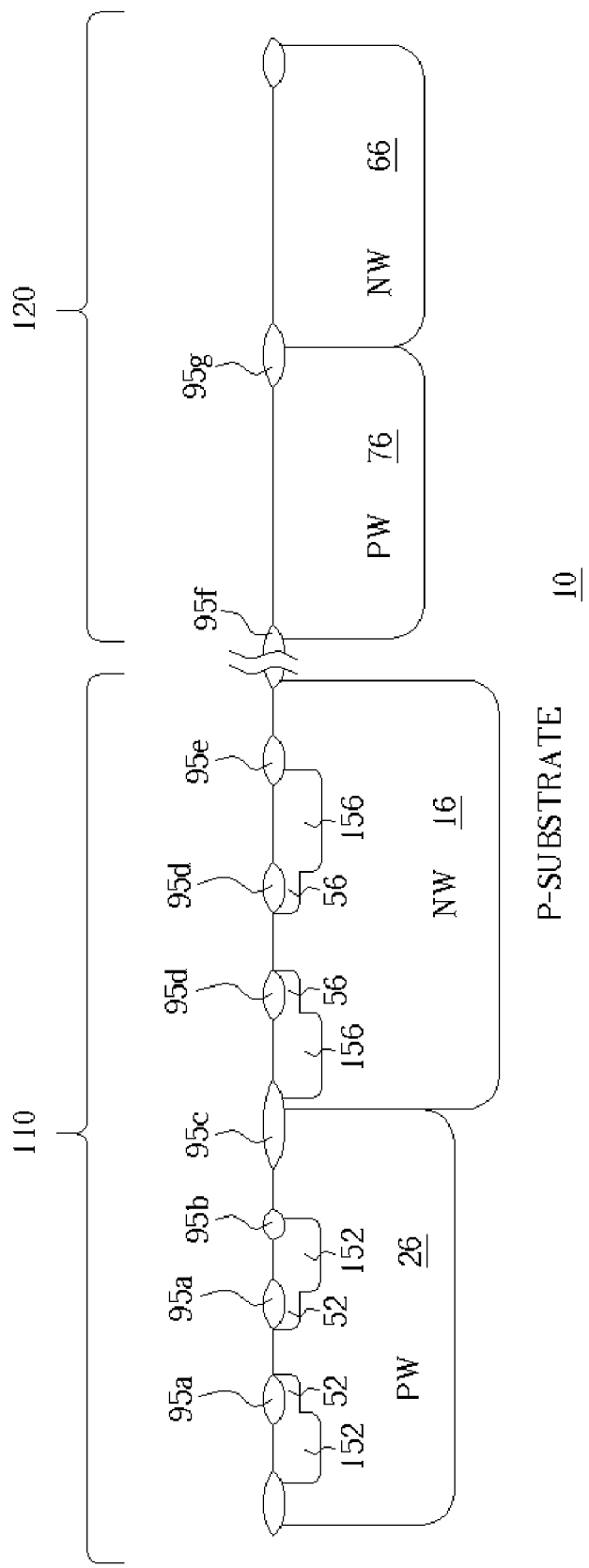

As shown in FIG. 11, a wet clean process is performed to remove the pad oxide layer 32 and an upper portion of the field oxide layers, thereby exposing silicon surface of the active areas.

Figure 12:
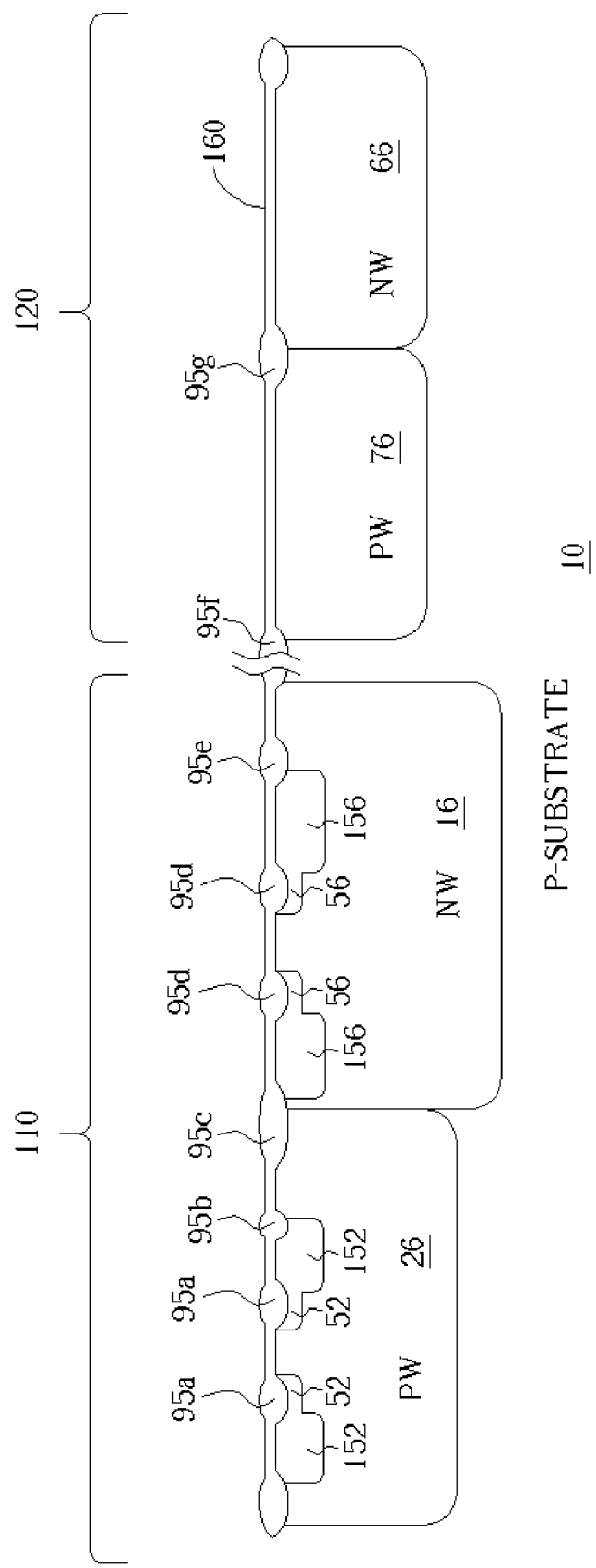

As shown in FIG. 12, a thick gate oxide layer 160 is thermally formed on the bare silicon surface of the active areas. Preferably, the thickness of the thick gate oxide layer 160 is about 700~900 angstroms, more preferably, 850 angstroms. It is noteworthy that the N grade region 152 and P grade region 156 are also driven in during the formation of the thick gate oxide layer 160.

Figure 13:
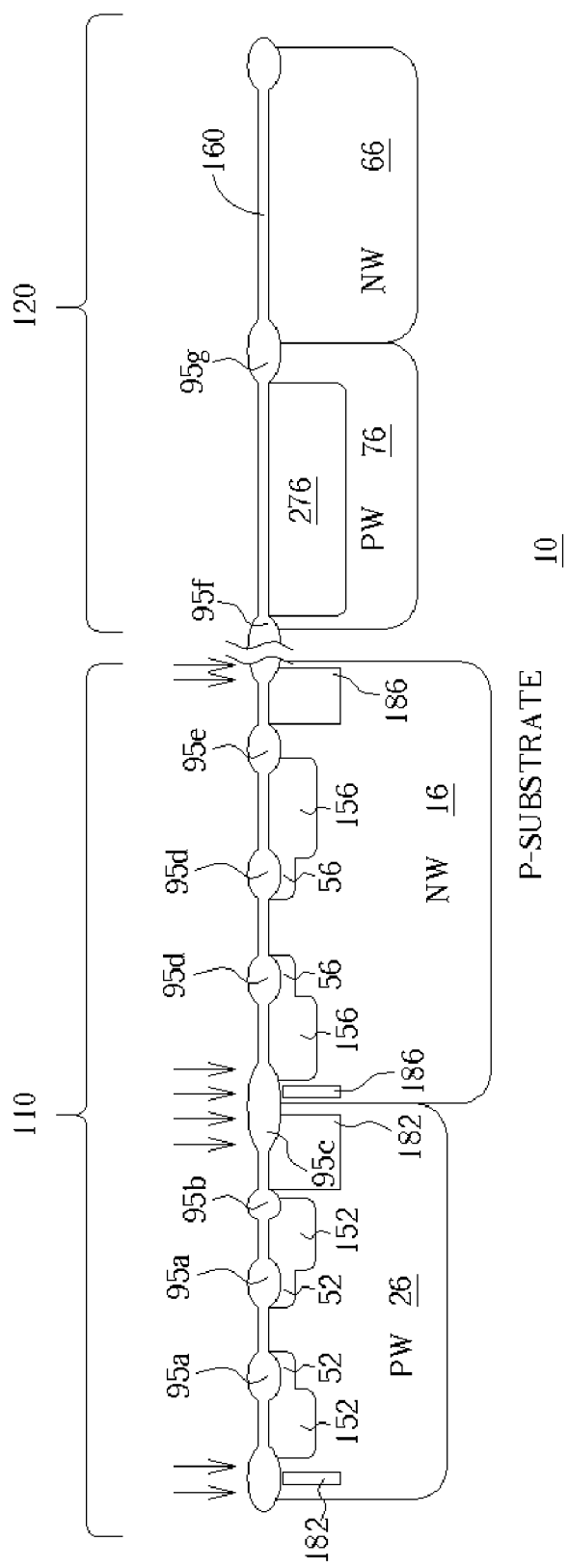

As shown in FIG. 13, P channel stop region 182 and N channel stop region 186 are implanted into the HVPW 26 and HVNW 16, respectively. It is noted that the P channel stop region 182 and N channel stop region 186 are implanted through the field oxide layers. It is highly suggested that the P channel stop region 182 and N channel stop region 186 are implanted into the semiconductor substrate 10 by using high-energy implantation (HEI) techniques. Threshold voltage adjustment for both NMOS and PMOS devices in the high voltage device area 110 is then carried out. After this, a P channel stop region and N-type Anti-Punch-Through (APT) 276 are formed in the LVPW 76.

Figure 14:
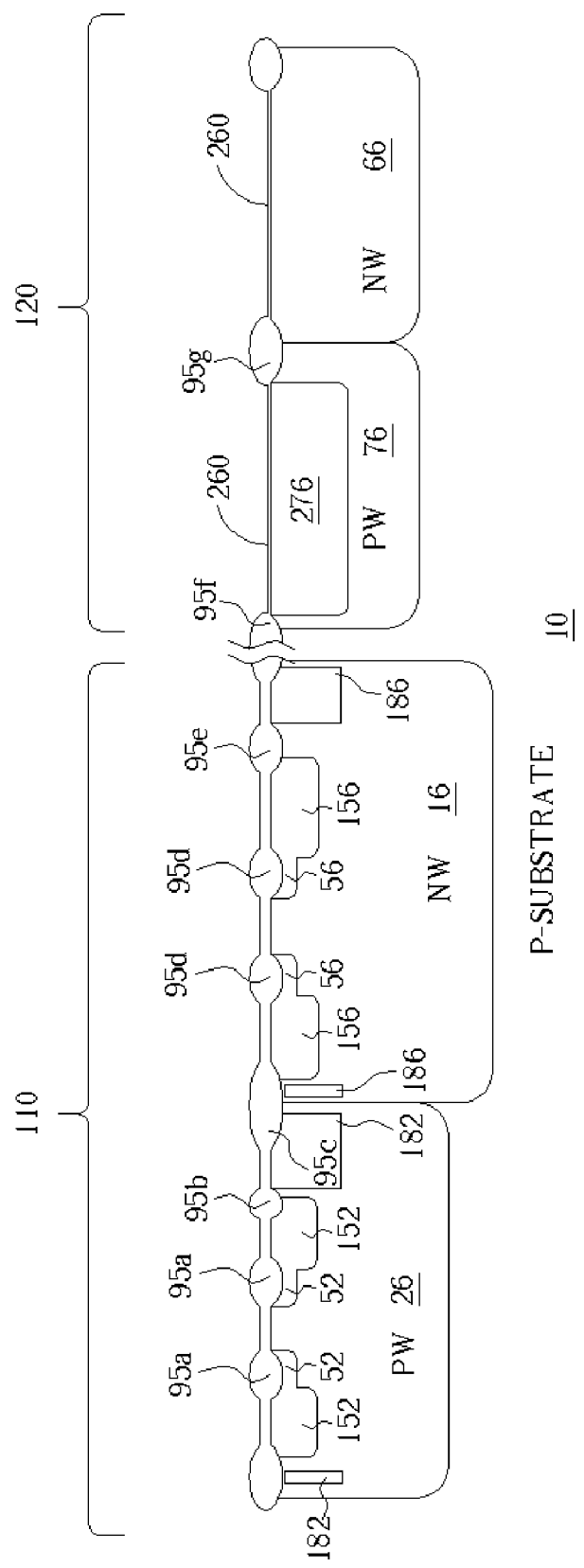

As shown in FIG. 14, a resist layer masking the high-voltage device area 110 but exposing the low-voltage device area 120 is formed on the substrate 10. The threshold voltage adjustment for the N/PMOS devices in the low-voltage device area 120 is then carried out. After the Vt adjustment, the exposed thick gate oxide layer 160 is etched away. A thin gate oxide layer 260 is then formed in the low-voltage device area 120. Preferably, the thickness of the thin gate oxide layer 260 is about 50~70 angstroms, more preferably, about 65 angstroms.

Figure 15:
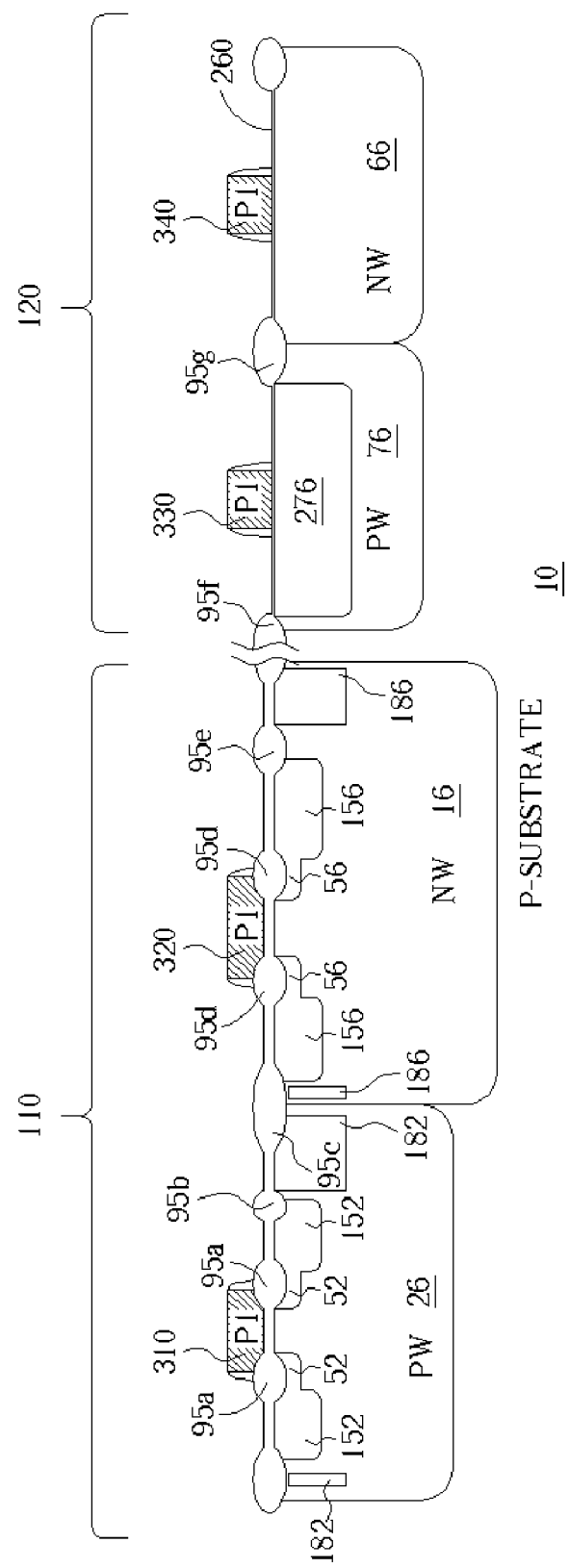

As shown in FIG. 15, a 1500 thick doped polysilicon layer (not explicitly shown) is formed over the gate oxide layers 160 and 260. A 1500 thick tungsten silicide (not explicitly shown) is formed on the doped polysilicon layer. The doped polysilicon layer and the tungsten silicide form a gate stack layer. The gate stack layer are then patterned into a plurality of gate structures 310, 320, 330, and 340, wherein the gate structures 310 and 320 are gates of HV NMOS device and HV PMOS device, respectively; the gate structures 330 and 340 are gates of LV NMOS device and LV PMOS device, respectively. After the formation of gates, spacers are formed on respective sidewalls of these gates, followed by an annealing process. Thereafter, a Lightly Doped Drain (LDD) process is carried out to form LDD layers in the low-voltage device area 120. During the LDD process, the high-voltage device area 110 is masked by a photoresist layer.

Figure 16:
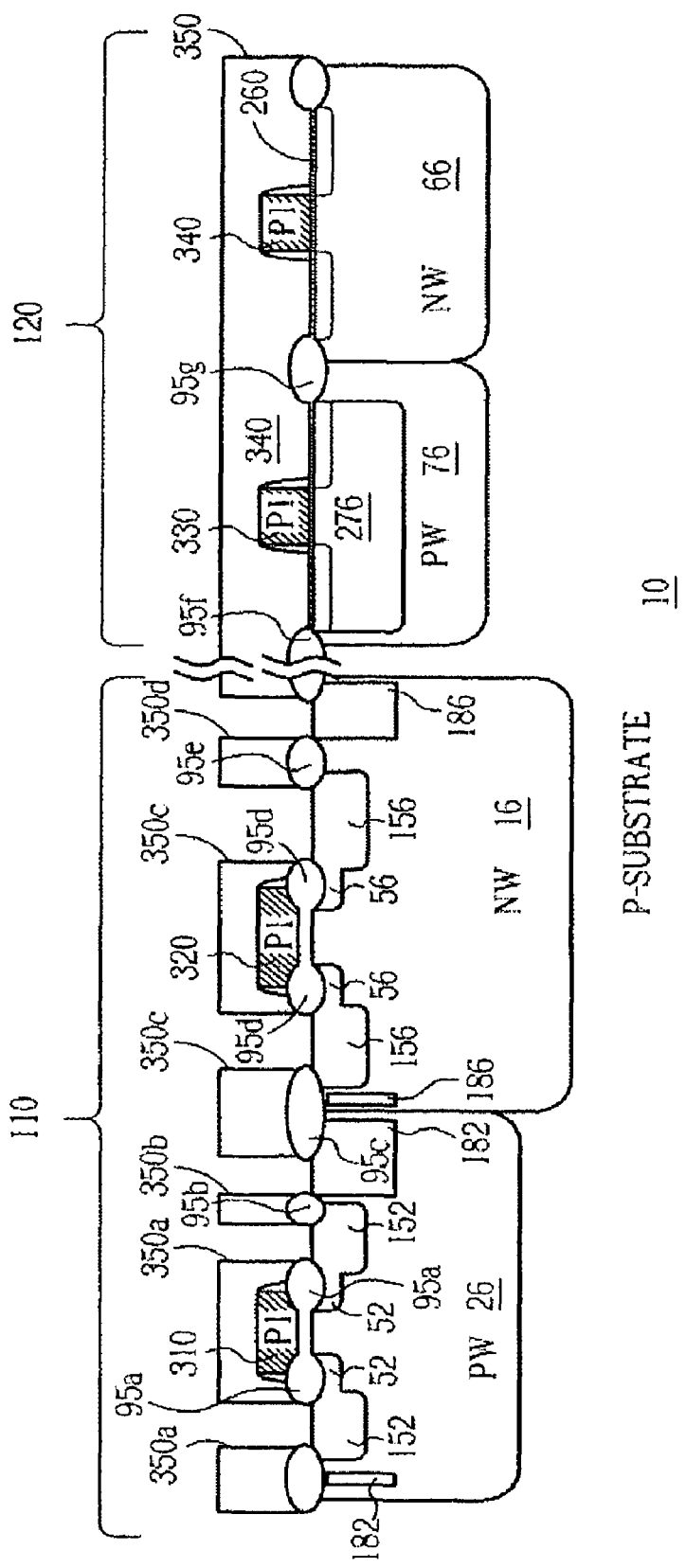

As shown in FIG. 16, a patterned photo resist layer 350 is formed over the semiconductor substrate 10. The photo resist layer 350 masks the low voltage device area 120 and has a plurality of openings 350a, 350b, 350c, and 350d exposing a portion of the high voltage device area 110. The exposed portions of the high voltage device area 110 through the openings 350a, 350b, 350c, and 350d are those areas to be heavily implanted with N type or P type dopants. Thereafter, using the patterned photo resist layer 350 as an etching mask, the high voltage gate oxide layer 160 is etched through the openings 350a, 350b, 350c, and 350d. The photo resist layer 350 is then removed.

Figure 17:
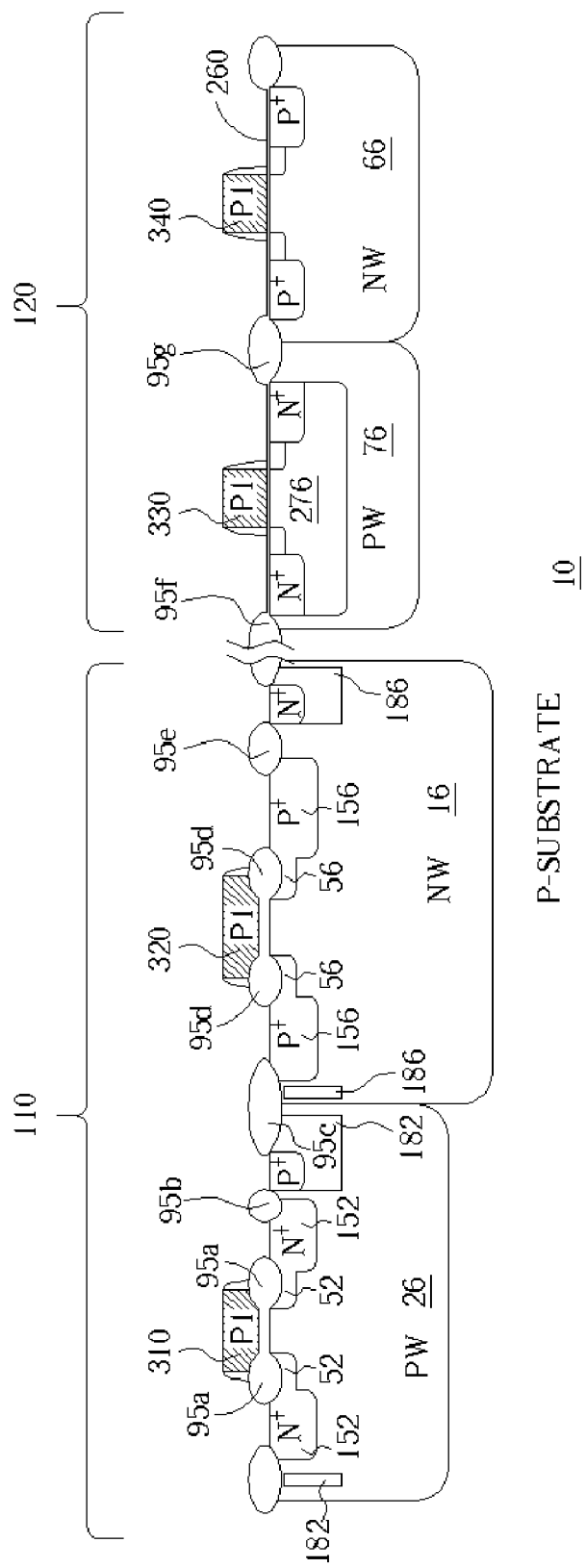

As shown in FIG. 17, $P^+$ regions are implanted into the high voltage device area 110 and low voltage device area 120 using a $P^+$ photo mask defining $P^+$ layer. Subsequently, $N^+$ regions are implanted into the high voltage device area 110 and low voltage device area 120 using a $N^+$ photo mask defining $P^+$ layer. After the doping of the $N^+/P^+$ layers on the semiconductor substrate 10, an annealing process is performed.

Figure 18:
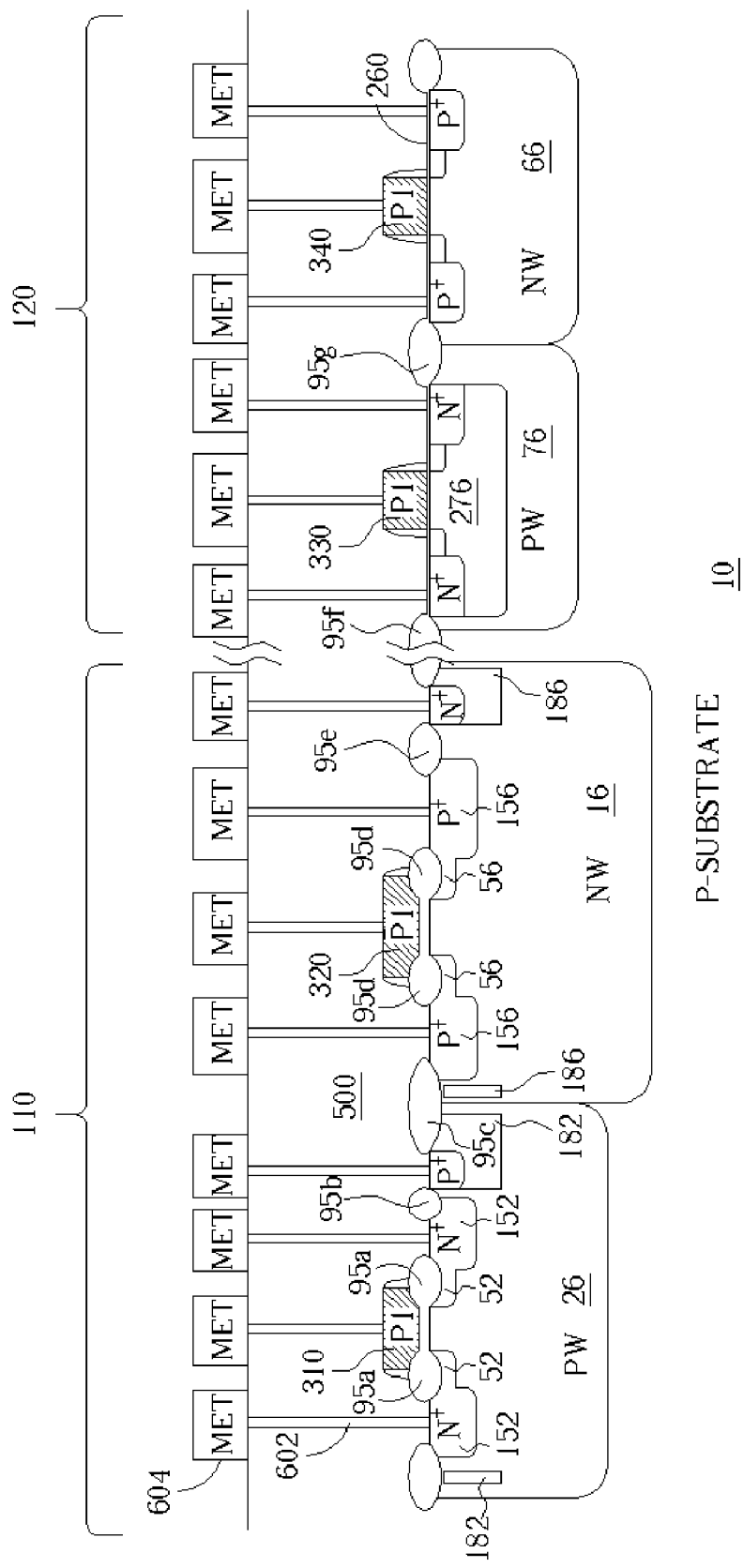

Finally, as shown in FIG. 18, a dielectric layer 500 is deposited over the high voltage device area 110 and low voltage device area 120 using conventional CVD methods. Metal interconnection process is then carried out to form contact plugs 602 and circuit pattern 604.

It is advantageous to use the present invention because: (1) the encroachment under SiN is alleviated since the implantation of HVNW and HVPW and the drive-in process thereof are performed prior to the definition of the active areas; (2) the drive-in process of the grade regions 52 and 56 of the high voltage device area 110 is accomplished simultaneously with the formation of thick gate oxide layer 160, thereby avoiding potential field oxide thinning and kink effect of the low voltage devices; (3) the N type channel stop and P type channel stop of the high voltage device area 110 are implanted after the formation of the field oxide layers; (4) no polysilicon fence defects will be formed at the boundary between the high voltage device area 110 and low voltage device area 120.

Those skilled in the art will readily observe that numerous modification and alterations of the present invention method may be made while retaining the teachings of the invention. Accordingly, the above disclosure should be construed as limited only by the metes and bounds of the appended claims.

What is claimed is:

1. A method of fabricating integrated circuits having both high voltage and low voltage devices, wherein a provided substrate contains at least one high-voltage device area and at least one low-voltage device area, and a first pad oxide layer over the substrate, the method comprising:
   performing a first ion implantation process to form a first ion well of a first conductivity type in the substrate within the high-voltage device area;
   performing a second ion implantation process to form a second ion well of a second conductivity type in the substrate within the high-voltage device area;
   stripping the first pad oxide layer;
   forming a second pad oxide layer;

forming a masking layer over the second pad oxide layer;
forming a plurality of openings in the masking layer to exposed a portion of the second pad oxide layer;
performing a third ion implantation process to implant ions of the first conductivity type into the second ion well within the high-voltage device area, to form a first drift layer;
thereafter performing a fourth ion implantation process to implant ions of the first conductivity type into the low-voltage device area, to form a third ion well of the first conductivity type;
thereafter performing a fifth ion implantation process to implant ions of the second conductivity type into the low-voltage device area, to form a fourth ion well of the second conductivity type;
thereafter performing a sixth ion implantation process to implant ions of the second conductivity type into the first ion well within the high-voltage device area, to form a second drift layer;
performing an oxidation process to form a plurality of field oxide isolation structures through the openings in the masking layer;
removing the masking layer and the second pad oxide layer;
forming a first gate oxide layer over the substrate;
performing a seventh ion implantation process to implant ions of the first conductivity type into the first ion well to form a first channel stop region within the high-voltage device area;
performing an eighth ion implantation process to implant ions of the second conductivity type into the second ion well to form a second channel stop region within the high-voltage device area;
performing a ninth ion implantation process in the fourth ion well within the low-voltage device area to form an anti-punch-through doping region in the fourth ion well;
removing the first gate oxide layer within the low-voltage device area;
growing a second gate oxide layer within the lowe-voltage device area; and
forming a plurality of gate structures on the first and second gate oxide layers.

2. The method of claim 1 wherein the first conductivity type is N type, and the second conductivity type is P type.

3. The method of claim 1 wherein the masking layer comprises silicon nitride layer.

4. The method of claim 1 wherein the first gate oxide layer has a thickness of about 700~900 angstroms.

5. The method of claim 1 wherein the second gate oxide layer has a thickness of about 50~70 angstroms.

6. A high-voltage semiconductor process compatible with low-voltage process, comprising:
preparing a substrate comprising at least one high-voltage device area and at least one low-voltage device area thereon;
implanting an N well and a P well into the high-voltage device area;
performing a first ion drive-in process to activate the N well and P well of the high-voltage device area;
forming a pad oxide layer and a masking layer over the substrate;
forming a plurality of openings in the masking layer to expose a portion of the pad oxide layer;
implanting N type dopants into the P well of the high-voltage device area to form a first drift layer;
performing a second ion drive-in process to activate the first drift layer;
implanting an N well and a P well into the low-voltage device area;
performing a third ion drive-in process to activate the N well and P well of the low-voltage device area;
implanting P type dopants into the N well of the high-voltage device area to form a second drift layer;
performing an oxidation process to form a plurality of isolation structures through the openings in the masking layer;
removing the masking layer;
implanting a plurality of grade regions in the high-voltage device area;
removing the pad oxide layer;
forming a first gate oxide layer on the substrate, and simultaneously driving in the plurality of grade regions in the high-voltage device area;
masking the high-voltage device area and removing the first gate oxide layer in the low-voltage device area;
growing a second gate oxide layer in the low-voltage device area; and
forming a plurality of gate structures in the low-voltage device area and the high-voltage device area.

7. The high-voltage semiconductor process compatible with low-voltage process according to claim 6 wherein the masking layer is silicon nitride layer.

8. The high-voltage semiconductor process compatible with low-voltage process according to claim 6 wherein the isolation structures are field oxide layers.

9. The high-voltage semiconductor process compatible with low-voltage process according to claim 6 wherein the first gate oxide layer has a thickness of about 700~900 angstroms.

10. The high-voltage semiconductor process compatible with low-voltage process according to claim 6 wherein the second gate oxide layer has a thickness of about 50~70 angstroms.

11. The high-voltage semiconductor process compatible with low-voltage process according to claim 6 wherein after driving in the plurality of grade regions in the high-voltage device area and before removing the first gate oxide layer in the low-voltage device area, the high-voltage semiconductor process compatible with low-voltage process further comprising the steps of:
implanting N type ions into the N well of the high-voltage device area to form N type channel stop; and
implanting P type ions into the P well of the high-voltage device area to form P type channel stop.

12. The high-voltage semiconductor process compatible with low-voltage process according to claim 6 wherein after driving in the plurality of grade regions in the high-voltage device area and before removing the first gate oxide layer in the low-voltage device area, the high-voltage semiconductor process compatible with low-voltage process further comprising the step of:
implanting an N type anti-punch-through doping region into the P well of the low-voltage device area.

* * * * *